US012560518B2

(12) United States Patent
    Parlak

(10) Patent No.: US 12,560,518 B2
(45) Date of Patent: Feb. 24, 2026

(54) APPARATUS AND METHOD FOR REAL TIME MEASURING OF RHEOLOGICAL PROPERTIES OF A FLUID

(71) Applicant: QATCH TECHNOLOGIES, Durham, NC (US)

(72) Inventor: Zehra Parlak, Chapel Hill, NC (US)

(73) Assignee: QATCH TECHNOLOGIES, Durham, NC (US)

( * ) Notice: Subject to any disclaimer, the term of this patent is extended or adjusted under 35 U.S.C. 154(b) by 561 days.

(21) Appl. No.: 17/768,937

(22) PCT Filed: Oct. 16, 2020

(86) PCT No.: PCT/US2020/055947
    § 371 (c)(1),
    (2) Date: Apr. 14, 2022

(87) PCT Pub. No.: WO2021/076867
    PCT Pub. Date: Apr. 22, 2021

(65) Prior Publication Data
    US 2023/0221233 A1     Jul. 13, 2023

Related U.S. Application Data

(60) Provisional application No. 62/923,106, filed on Oct. 18, 2019.

(51) Int. Cl.
    *G01N 11/16*          (2006.01)
    *H10N 30/20*          (2023.01)
        (Continued)
(52) U.S. Cl.
    CPC ........... *G01N 11/16* (2013.01); *H10N 30/208* (2023.02); *H10N 30/302* (2023.02); *H10N 30/853* (2023.02); *G01N 2011/0073* (2013.01)

(58) Field of Classification Search
    CPC ........... G01N 11/16; G01N 2011/0073; H10N 30/208; H10N 30/302; H10N 30/853
    See application file for complete search history.

(56) References Cited

U.S. PATENT DOCUMENTS 3,763,385 A * 10/1973 Mossotti ............... F04B 43/095
                                                          356/315
6,543,274 B1    4/2003 Herrmann et al.
                    (Continued)

FOREIGN PATENT DOCUMENTS

EP          2278298 A1     1/2011
WO      WO2004072622     *  8/2004
WO        2018058113 A2    3/2018

OTHER PUBLICATIONS

Sanger-van de Griend CE. Enantiomeric separations by capillary electrophoresis in pharmaceutical € analysis. Acta Universitatis Upsaliensis; 1999. ISBN: 91-554-4561-6 (Year: 1999).*
                    (Continued)

*Primary Examiner* — John E Breene
*Assistant Examiner* — Alex T Devito
(74) *Attorney, Agent, or Firm* — Sage Patent Group

(57)                    ABSTRACT

A method is provided to measure viscosity of an analyte using a microfluidic piezoelectric sensor including a channel on an active area of a piezoelectric resonator substrate. The microfluidic piezoelectric sensor is driven so that the active area of the piezoelectric resonator substrate generates shear motion in a direction of shear motion displacement that is parallel with respect to a first surface of the piezoelectric resonator substrate. A high shear-rate viscosity of the analyte is determined based on a shift in resonance of the microfluidic piezoelectric sensor while driving the microfluidic piezoelectric sensor with the analyte in the channel. A low shear-rate viscosity of the analyte is determined by detecting flow of the analyte through the channel based on tracking
                    (Continued)

100 shifts in resonance of the microfluidic piezoelectric sensor. Related sensors are also discussed.

20 Claims, 10 Drawing Sheets

(51) Int. Cl.
| | |
|---|---|
| *H10N 30/30* | (2023.01) |
| *H10N 30/853* | (2023.01) |
| *G01N 11/00* | (2006.01) |

(56) References Cited

U.S. PATENT DOCUMENTS

| | | | |
|---|---|---|---|
| 7,500,379 | B2 | 3/2009 | Hines |
| 9,096,823 | B1 | 8/2015 | Branch et al. |
| 2006/0057733 | A1* | 3/2006 | Liu ..................... B01D 15/367 |
| | | | 436/161 |
| 2006/0144237 | A1* | 7/2006 | Liang ................. G01N 30/6095 |
| | | | 96/101 |

| | | | |
|---|---|---|---|
| 2008/0215245 | A1* | 9/2008 | Reittinger ............... E21B 49/10 |
| | | | 73/152.55 |
| 2011/0235641 | A1 | 9/2011 | Wada |
| 2014/0051107 | A1 | 2/2014 | Babcock et al. |
| 2016/0116402 | A1 | 4/2016 | Chen et al. |
| 2017/0370866 | A1 | 12/2017 | Desa et al. |
| 2018/0275088 | A1 | 9/2018 | Huff et al. |
| 2019/0234907 | A1 | 8/2019 | Edwards et al. |

OTHER PUBLICATIONS

International Search Report and Written Opinion of the International Searching Authority, PCT/US2020/055947, mailed Feb. 26, 2021, 10 pages.
Ioana, V., et al. "Acoustic wave based MEMS devices for biosensing applications", Biosensors and Bioelectronics, Elsevier Science, 33(1), Dec. 1-9, 2011.
Srivastava, N., et al. "Nanoliter Viscometer for Analyzing Blood Plasma and Other Liquid Samples", Analytical Chemistry, (77), 383-392, Jan. 2005.
Extended European Search Report for EP Patent Application No. 20877284.8, mailed Oct. 19, 2023, 10 pages.

\* cited by examiner

3rd mode of 5 MHz crystal with microfluidics

5 MHz

Time (Secs)

5 MHz

Time (Secs)

15 MHz

Time (Secs)

15 MHz

Time (Secs)

15 MHz

Time (Secs)

15 MHz

Time (Secs)

Begin

Drive Microfluidic
Piezoelectiric Sensor
803

Determine High Shear-Rate
Viscosity
809

Determine Low Shear-Rate
Viscosity
815

End

Begin

Heat Analyte
901

Drive Acoustic Wave
Generator
903

Measure Filling Time
Acoustically
909

Measure at Least One of
Dissipation/Frequency
Response
915

Determine Material Property
of Analyte
921

End

APPARATUS AND METHOD FOR REAL TIME MEASURING OF RHEOLOGICAL PROPERTIES OF A FLUID

CROSS REFERENCE TO RELATED APPLICATIONS

This application is a 35 U.S.C. § 371 national stage application of PCT International Application No. PCT/US2020/055947 filed on Oct. 16, 2020, which claims the benefit of priority to U.S. Provisional Application No. 62/923,106, filed Oct. 18, 2019, the disclosures and content of which are incorporated by reference herein in their entireties.

CROSS REFERENCE TO RELATED APPLICATION

The present application claims the benefit of priority to U.S. Provisional Application No. 62/923,106, filed 18 Oct. 2019, the disclosure and content of which is hereby incorporated herein in its entirety by reference.

STATEMENT OF GOVERNMENT RIGHTS

This invention was made with government support under Grant Number 70NANB 19H042 awarded by the National Institute of Standards and Technology (NIST). The government has certain rights in the invention.

FIELD OF THE INVENTION

The present disclosure generally relates to devices and methods used to test the rheology of fluids, such as the viscosity, elasticity, and/or consistency of fluids, including high concentration protein formulations.

BACKGROUND

Large biological molecules—"biotherapeutics"—are an important class of drugs. Monoclonal antibodies for example may offer therapeutic specificity, long biological half-life, and/or high safety profiles.

Biotherapeutics given their size and complexity are difficult to manufacture and formulate. Most biotherapeutics are formulated as lyophilized solids or liquid formulations, and stability/instability of these molecules may be a problem. Stability/instability not only impacts shelf life of the final product, but also the manufacturing process.

A large molecule by definition has a large molecular mass. Therefore, a few moles of a drug may encompass a relatively large mass. For example, an antibody may have a molecular mass of about 150,000 grams per mole, whereas a small molecule drug like atorvastatin may have a molecular mass of about 560 grams per mole. Therefore, to attain an effective dose, a high mass of protein drug may be required. As more drugs are formulated for subcutaneous injection, that large mass has to fit into a small volume. To accommodate therapeutically effective doses, subcutaneous formulations of biotherapeutic drugs must attain high (e.g., about 50 mg/mL or more) or very high (e.g., about 100-500 mg/mL) concentrations, all while keeping viscosity at a manageable level.

As large molecules are crammed into a small space and distances between protein molecules decrease, the frequency of colloidal interactions, i.e., the through-space effect of one molecule on another, increases. Protein self-interactions (colloidal interactions) are generally energetically weak, typically reversible and non-specific. The interactions are protein-dependent and are affected by pH, salt and other additives. In some cases, the interactions may be net attractive, repulsive, or neutral.

Colloidal interactions span a broad spectrum of interactions (potential energy) that are quantified with viral coefficients. A positive viral coefficient value represents repulsive interactions, a negative viral coefficient represents attractive interactions, and a zero viral coefficient represents an ideal state.

Colloidal interactions are generally present in protein solutions that exceed 2 mg/mL and become significant in solutions that exceed 40 mg/mL. At the lower concentrations, steric and electrostatic forces tend to dominate. The situation becomes more complex with increasing protein concentration. As the concentration of protein increases during production and formulation, colloidal interactions may become problematic.

Colloidal interactions may impact a variety of downstream processes during protein production. Those forces may be beneficial or detrimental depending on nature and magnitude of the interactions. Colloidal interactions affect chromatographic performance, ultrafiltration and diafiltration (UF/DF), dialysis, injectability, viscosity and solution handling, and stability of the protein in solution. Colloidal interactions also impact long term stability during storage, where oligomers and multimers, as well as protein aggregates can form. Assessment of a protein's virial coefficient may therefore provide important information before committing resources to the development of a particular protein therapeutic.

As such, proteins are complex molecules and often show unpredictable behavior under varying conditions. The state-of-the art provides some means for observing protein self-association, but does not provide a rapid and accurate means to determine the propensity of a protein to undergo self-association under myriad different conditions. Some proteins are stable under some conditions, but unstable under other conditions. There remains a need in the art for an assay to determine the ability to formulate, inject, and manufacture such proteins and their associated products.

SUMMARY

According to some embodiments of inventive concepts, a sensor includes a piezoelectric resonator substrate, a first electrode on a first surface of the piezoelectric resonator substrate, a second electrode of a second surface of the piezoelectric resonator substrate, and a channel structure rigidly coupled to the first surface of the piezoelectric resonator substrate. An active area of the piezoelectric resonator substrate is defined between the first electrode and the second electrode so that the active area of the piezoelectric resonator substrate is configured to generate shear motion in a direction of shear motion displacement that is parallel with respect to the first surface. The channel structure defines a serpentine channel between the channel structure and the piezoelectric resonator substrate. The serpentine channel includes a plurality of channel segments connected in series, the channel structure defines an inlet opening coupled with the serpentine channel to allow ingress of an analyte into the serpentine channel, and at least portions of the plurality of channel segments are on the active area of the piezoelectric resonator substrate.

According to some embodiments of inventive concepts, a method is provided to measure viscosity of an analyte using a microfluidic piezoelectric sensor including a channel on an active area of a piezoelectric resonator substrate. The microfluidic piezoelectric sensor is driven so that the active area of the piezoelectric resonator substrate generates shear motion in a direction of shear motion displacement that is parallel with respect to the microfluidic channel length. A high shear-rate viscosity of the analyte is determined based on a shift in resonance of the microfluidic piezoelectric sensor while driving the microfluidic piezoelectric sensor with the analyte in the channel. A low shear-rate viscosity of the analyte is determined by detecting flow of the analyte through the channel based on tracking shifts in resonance of the microfluidic piezoelectric sensor.

According to some embodiments of inventive concepts, systems and/or methods may thus be provided to determine the injectability, manufacturability, and/or formulation capabilities across a dynamic range of protein concentrations and other pharmaceutical and biopharmaceutical products.

BRIEF DESCRIPTION OF THE DRAWINGS

The following drawings form part of the present specification and are included to further demonstrate certain aspects of the present invention. The invention may be better understood by reference to one or more of these drawings in combination with the description of specific embodiments presented herein.

FIGS. 3B-1 and 3B-2 respectively illustrate simulation and experimental responses of a capillary quartz sensor to a sample of 40% w glycerol at 15 MHz according to some embodiments of inventive concepts.

FIGS. 3C-1 and 3C-2 respectively illustrate simulation and experimental responses of a capillary quartz sensor to a sample of 40% w glycerol at 25 MHz according to some embodiments of inventive concepts.

DETAILED DESCRIPTION

Figure 1A:
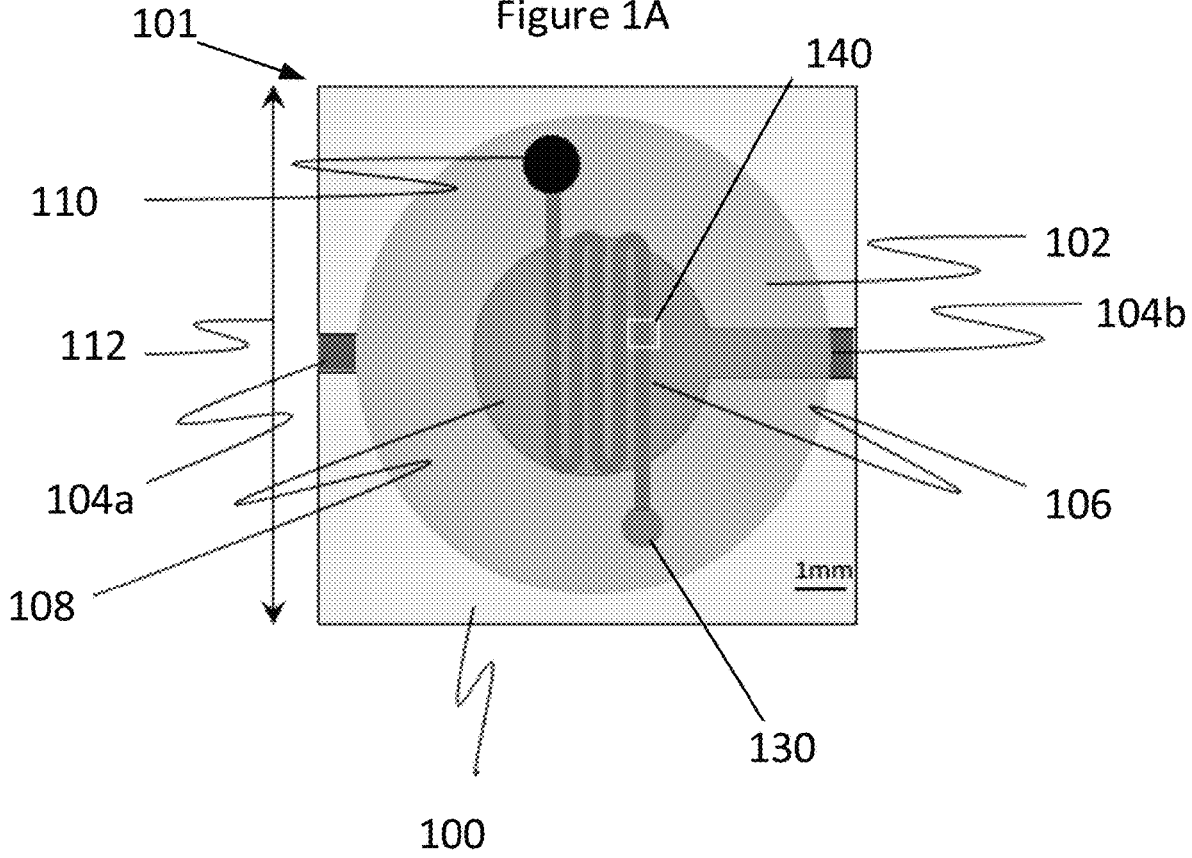
FIG. 1A illustrates a top view of a microfluidic quartz sensor according to some embodiments of inventive concepts.

Inventive concepts will now be described more fully hereinafter with reference to the accompanying drawings, in which examples of embodiments of inventive concepts are shown. Inventive concepts may, however, be embodied in many different forms and should not be construed as limited to the embodiments set forth herein. Rather, these embodiments are provided so that this disclosure will be thorough and complete, and will fully convey the scope of present inventive concepts to those skilled in the art. It should also be noted that these embodiments are not mutually exclusive. Components from one embodiment may be tacitly assumed to be present/used in another embodiment.

The following description presents various embodiments of the disclosed subject matter. These embodiments are presented as teaching examples and are not to be construed as limiting the scope of the disclosed subject matter. For example, certain details of the described embodiments may be modified, omitted, or expanded upon without departing from the scope of the described subject matter.

Methods and assays used to select proteins and formulation conditions that have high self-repulsive attributes may be used as an early step in the pharmaceutical, nutraceutical and biopharmaceutical manufacturing process. A sample concentration dependent rheological method may be used as a formulation, injectability and manufacturability assay according to some embodiments disclosed herein.

Some embodiments of inventive concepts described herein provide a system and method to determine the injectability, manufacturability and/or formulation capabilities across a dynamic range of protein concentrations. Consequently, systems and methods according to some embodiments may be understood as providing a method to determine injectability, manufacturability and/or formulation capabilities and/or as providing a system based on microfluidic quartz resonator (MQR) technology, as is further elaborated herein.

Systems and methods according to some embodiments may harness semiconductor fabrication principles to rigidly couple micro-channels of ~2 nanoliters of volume to the quartz resonator surface. The quartz resonators intrinsically operate at very high shear rates (e.g., >1,000,000 l/s, or >5,000,000 l/s), and the shifts in the MQR resonance spectrum can be used to directly determine the high shear-rate viscosity of liquid inside the channels. Concurrently, the MQR channels also function as an acoustic capillary viscometer, measuring the low shear rate viscosities (e.g., in the range of about 20 l/s to about 40,000 l/s) by observing fluid flow. This is accomplished by detecting the position of the fluid flow via tracking resonance frequency shifts. The method enables the prediction of the protein at high or very high concentration conditions and informs the selection of proteins for commercial development.

Some embodiments of inventive concepts use MQR technology to address the growing needs of the biopharmaceutical industry in the characterization of concentrated protein formulations. These high concentration protein formulations are typically created for subcutaneous injections and exhibit a complex shear-thinning behavior with low and high shear-rate plateaus. Injectability testing of these formulations by rheometry may require understanding of their rheological behavior at both low and high shear-rates. However, sample volumes available in early development stages may not be sufficient for a wide range characterization with existing instrumentation. This problem may be addressed using an MQR-based microfluidic viscometer according to some embodiments of inventive concepts that may require only a small sample (e.g., ~5 microliters, with only a few nanoliters being used) and that may provide viscosity information from about 20 s$^{-1}$ (1/s) to about 40,000 s$^{-1}$ (1/s) and >1,000,000 s$^{-1}$ (1/s) (e.g., >5,000,000 1/s) in under 2 minutes. Having this critical rheological data available at an early development stage can de-risk candidate selection processes and reduce process development costs.

Systems and methods according to some embodiments of inventive concepts may thus provide information on how to formulate a pharmaceutical composition comprising high concentrations of one or more biopharmaceutical drugs, the injectability of such pharmaceutical compositions and/or the manufacturability of such pharmaceutical compositions. Such systems and methods may thus be used to provide information on how to formulate a composition fulfilling required specifications on physical properties such as, e.g., a suitable rheology/viscosity to allow for a specific desired route of administration. Some embodiments of inventive concepts may also provide a more rapid screening of biopharmaceuticals using a lesser amount of material to arrive at a suitable formulation or to select suitable candidates for further drug development.

Embodiments of the present disclosure generally relate to acoustic waves in microfluidics. The subject matter of the present invention involves, in some cases, interrelated products, alternative solutions to a particular problem, and/or a plurality of different uses of one or more systems and/or articles. Some embodiments are generally directed to a sensor comprising a resonator, the resonator having a front surface and back surface, at least one structure comprising at least one channel wherein the structure is disposed on at least one of said front surface and back surface, and where the structure of at least one channel is configured serve as a conduit for a media to be analyzed.

Some other embodiments of the present disclosure are directed to a method of operating a sensor comprising driving a resonator of the sensor at a driving amplitude and frequency such that a structure on a surface of the resonator moves a media within said structure to be sensed, measuring a dissipation response of the resonator, and determining a material property of said media to be sensed based on the measured dissipation response.

Some further embodiments of the present disclosure are directed to a method for determining the rheological properties of a protein sample, the method comprising placing a protein sample within a MQR device, exciting the protein sample with acoustic energy, measuring concurrently the fluid position within the MQR as a function of time and the interaction of the protein sample with the channel structure by monitoring the acoustic energy, calculating concurrently the fill rate of the MQR and changes in the acoustic energy, and determining at least one rheological property of the protein sample where the protein sample is stable at high concentration.

Before embodiments of inventive concepts are described, it is to be understood that inventive concepts are not limited to particular methods and experimental conditions described, as such methods and conditions may vary. It is also to be understood that the terminology used herein is for the purpose of describing particular embodiments only, and is not intended to be limiting, since the scope of the present inventive concepts will be defined by the appended claims.

Unless defined otherwise, all technical and scientific terms used herein have the same meaning as commonly understood by one of ordinary skill in the art to which the present disclosure belongs. As used herein, the term "about", when used in reference to a particular recited numerical value, means that the value may vary from the recited value by no more than 15%. For example, as used herein, the expression "about 100" includes 85 and 115 and all integer and non-integer values in between (e.g., 86, 86.001, 87, 88, 88.3, 89, etc. . . . ).

Absolute amounts and relative amounts of excipients, ingredients, and other materials may be described by mass, or moles. Units of mass may be expressed as grams, milligrams, micrograms, and the like). The term "weight" as in "weight/volume" or "w/v" means "mass". Relative amounts may be expressed as percent weight (i.e., percent mass), wherein one (1) percent weight to volume (w/v) means 1 gram of material per 100 milliliter of volume. Also for example, one (1) part ingredient "A" per one (1) part ingredient "B" by weight means, e.g., that for every one (1) gram of ingredient "A" there is one (1) gram of ingredient "B". Also for example, one percent (1%) by weight of ingredient "A" means, e.g., that for every 100 grams of total mass of a particle there is one (1) gram of ingredient "A". Relative amounts of an ingredient may also be expressed in terms of moles or number of molecules per given volume, e.g., millimoles per liter (millimolar (mM)), or per other ingredient, e.g., X part ingredient "A" per Y part ingredient "B" by mole means for every X moles of "A" there are Y moles of "B".

It is generally regarded that protein samples are considered those of proteins or protein derivatives in a sample solution.

Although any methods and materials similar or equivalent to those described herein can be used in the practice or testing of the present inventive concepts, examples of methods and materials are now described according to some embodiments of inventive concepts.

Some embodiments of inventive concepts described herein relate to an acoustic microcapillary viscometer. In one application, such a microcapillary viscometer can be used as an injectability and manufacturability screening tool for high concentration protein formulations (HCFs). These HCFs are used as biopharmaceutical therapeutics, and the described microcapillary viscometer may be useful to reduce the time and cost of biopharmaceutical drug development. These HCFs (e.g., protein concentrations of >100 mg/ml) may exhibit shear-thinning non-Newtonian behavior. The viscosity responses of these HCFs may be highly dependent on protein-protein interactions. In some instances, dependency is evident in having two very similar molecules having very different behaviors. Injecting these HCFs from thin needles expose them to high shear-rates in the range of about $10^5$ s$^{-1}$ to about $10^6$ s$^{-1}$, and the viscosity of the HCF at these shear-rates may determine/influence the injection force and duration, which impacts patient comfort and adherence.

During preclinical research, biopharmaceutical companies examine multiple candidates for a drug and generally select 1-3 of the candidates for preclinical scale-up, which costs ~$1M/candidate (batch size of 200 L, 3 batches). Before preclinical scale up of the candidate, the companies may have only ~10 mg of protein available (e.g., in the range of about 50 μl (microliter) to about 100 μl (microliter)) for all testing, and this volume may not be enough to determine the injectability with existing techniques and instruments. Therefore, the biopharmaceutical industry takes risk due to the unknown injectability when making these high cost decisions. If a candidate is discovered to be un-injectable after scale-up, it may extend the timeline and/or increase the cost of drug discovery. Some embodiments of inventive concepts described herein may address this problem by providing injectability screening with very low volumes.

According to some embodiments of inventive concepts, a class of an acoustic wave sensor may be provided. Acoustic waves are a type of energy propagation through a medium by means of adiabatic compression and decompression. Important quantities for describing acoustic waves are acoustic pressure, particle velocity, particle displacement and acoustic intensity. Acoustic waves travel with a characteristic acoustic velocity that depends on the medium they're passing through. Some examples of acoustic waves are audible sound from a speaker (waves traveling through air at the speed of sound), ground movement from an earthquake (waves traveling through the earth), or ultrasound used for medical imaging (waves traveling through the body).

Conventionally, an acoustic generator represented by a piezoelectric speaker can be provided as small-sized and low-current drive acoustic equipment in which a piezoelectric body is used as an electro-acoustic conversion element. The acoustic generator is used, for example, as an acoustic generation device incorporated in a small-sized electronic apparatus such as a mobile computing device.

Generally, the acoustic generator, in which the piezoelectric body is used for the electro-acoustic conversion element (having a structure in which a piezoelectric element with an electrode made of a thin silver film or the like formed thereon) is attached to a metallic vibration plate using an adhesive. In a sound generation mechanism of the acoustic generator in which the piezoelectric body is used for the electro-acoustic conversion element, an alternate-current (AC) voltage is applied to both surfaces of the piezoelectric element so that the form distortion occurs in the piezoelectric element, and the form distortion of the piezoelectric element is transmitted to the metallic vibration plate and vibrates it, whereby sound is generated.

Bulk acoustic wave resonators (both piezoelectric substrates such as quartz and thin film piezoelectric substrates such as AlN, ZnO) generating shear vibrations can be used.

Surface acoustic devices generating shear motion on the surface can be used. In one instance, a Love wave is a surface wave having a horizontal motion that is transverse (or perpendicular) to the direction the wave is traveling.

Figure 1B:
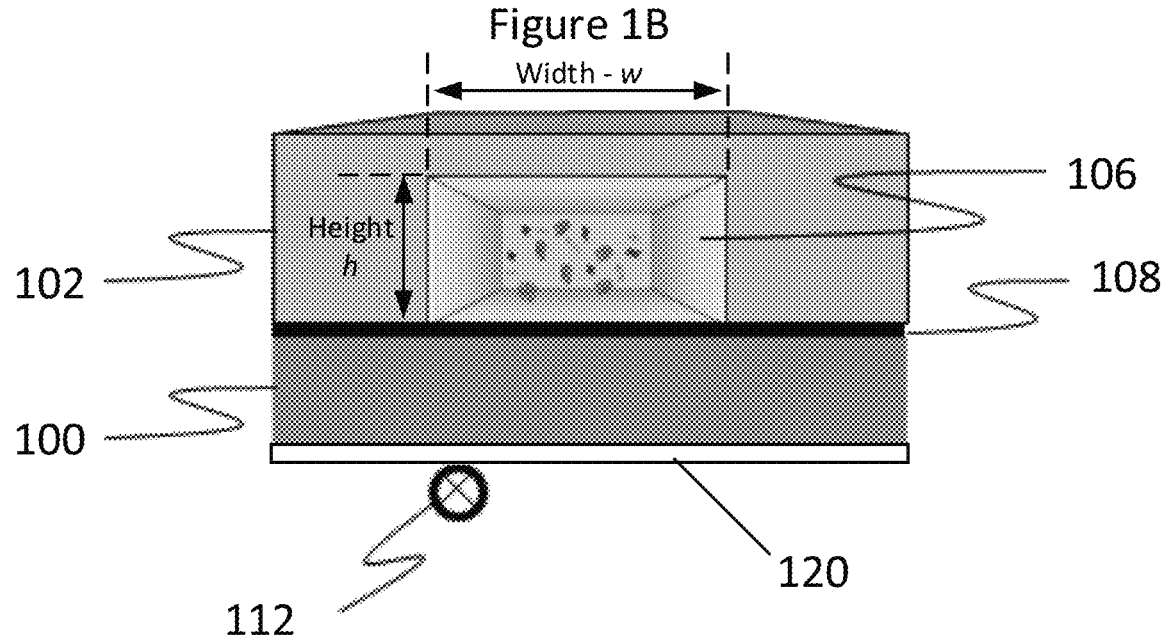
FIG. 1B is a cross-sectional view looking into a single microfluidic channel (thickness<10 μm) taken through section 140 of FIG. 1A in a direction perpendicular with respect to a length of the channel, with a direction of shear motion indicated into the plane of FIG. 1B according to some embodiments of inventive concepts.
Figure 1C:
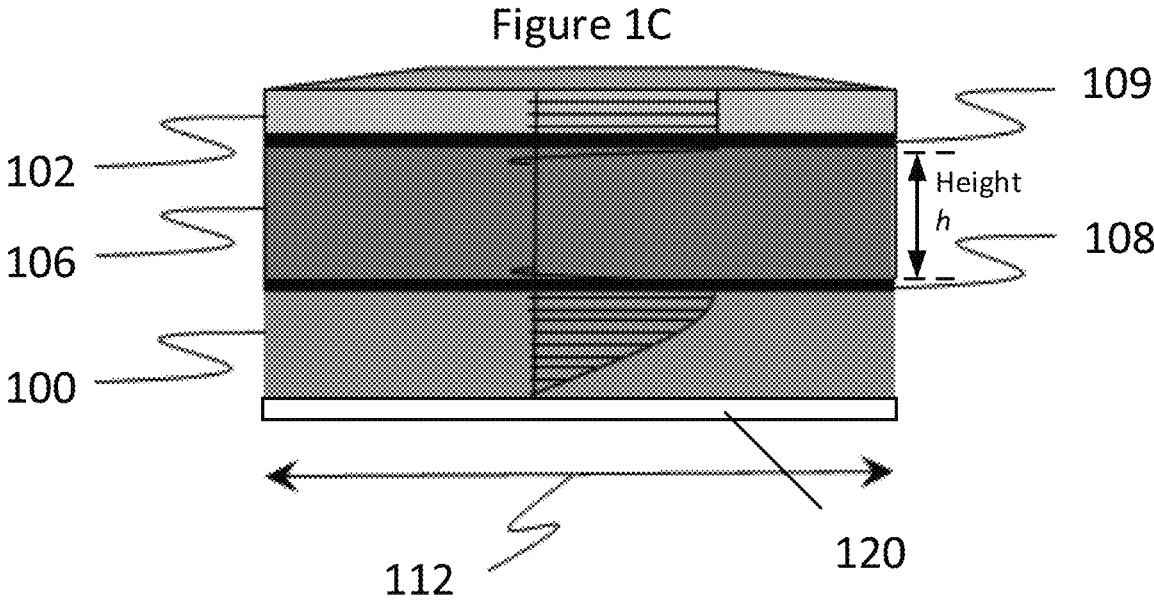
FIG. 1C is a cross-sectional view looking into the single microfluidic channel of FIG. 1B taken through section 140 of FIG. 1A in a direction parallel with respect to the length of the channel, with the direction of shear motion indicated parallel to the plane of FIG. 1C according to some embodiments of inventive concepts.

In the acoustic microcapillary viscometer system of FIGS. 1A-1C, the design parameters may be determined based on simulations of capillary filling, quartz resonator radial dependency, and quartz response to an encapsulated fluid analyte. In one instance, the serpentine channel 106 could be 3.5 μm high (shown as height h in FIGS. 1B and 1C), 100 μm wide (shown as width w in FIG. 1B), and 8 mm long with 6 capillary channel segments connected in series. Fabrication of such a viscometer could be performed using photolithography wherein appropriate photolithography design masks would be created. This design can be fabricated on a quartz wafer with 10 nm (nanometer) thick gold coating (thin titanium can be used as an adhesive layer between gold and quartz). In some embodiments, the solid channel structure 102 of the microfluidic system will have three materials: gold, titanium, and aluminum. In this configuration, gold coats the inner channel surface (defining channel 106) while thick aluminum is the structural layer. In one instance, the fabrication includes three operations: 1) Photolithography. 2) Deposition (e.g., sputtering), and 3) Release.

In FIGS. 1A, 1B, and 1C, sensor 101 includes piezoelectric resonator substrate 100, first electrode 108 of a first surface of piezoelectric resonator substrate 100, second electrode 120 on a second surface of piezoelectric resonator substrate 100, and channel structure 102 rigidly coupled to the first surface of piezoelectric resonator substrate 100. Piezoelectric resonator substrate 100 may be/include a quartz substrate and/or a thin film piezoelectric material (e.g., aluminum nitride AlN and/or zinc oxide ZnO). Together, piezoelectric resonator substrate 100, first electrode 108, and second electrode 120 may provide an acoustic wave generator (also referred to as an acoustic wave actuator).

An active area of piezoelectric resonator substrate 100 is defined between first and second electrodes 108 and 120 so that the active area of the piezoelectric resonator substrate 100 is configured to generate shear motion in a direction 112 of shear motion displacement that is parallel with respect to the first surface responsive to an electrical signal applied to first and second electrodes 108 and 120 via leads 104*a* and 104*b*. As shown in FIGS. 1B and 1C, first electrode 108 may be between the first surface of piezoelectric resonator substrate 100 and channel structure.

Channel structure 102 defines a serpentine channel 106 (e.g., a serpentine capillary channel) between the channel structure 102 and the piezoelectric resonator substrate (100), and serpentine channel 106 includes a plurality of channel segments connected in series. Channel structure 106 may define inlet opening 110 coupled with serpentine channel 106 to allow ingress of an analyte (also referred to as media, sample, etc.) into serpentine channel 106, and at least portions of the plurality of channel segments are on the active area of piezoelectric resonator substrate 100. Channel structure 102 may also define exit opening 130 coupled with the serpentine channel 106, so that the plurality of channel segments of the serpentine channel are coupled in series between inlet opening 110 and exit opening 130 to define a flow path for the analyte between inlet and exit openings 110 and 130.

Each of the plurality of channel segments shown in FIG. 1A may be a linear channel segment that is parallel with respect to the direction 112 of shear motion displacement. While 5 linear channel segments are illustrated in FIG. 1A, sensor 101 may include any number of linear channel segments (e.g., one, two, three, or more linear channel segments) according to some embodiments of inventive concepts.

Moreover, the active area (between electrodes 108 and 120) of piezoelectric resonator substrate 100 may be configured to generate shear motion in the direction 112 of shear motion displacement at a frequency in the range of about 1

MHz to about 5,000 MHz responsive to application of an electrical signal across electrodes 108 and 120 (via leads 104a and 104b.

Serpentine channel 106 and each of the plurality of channel segments thereof in FIGS. 1A, 1B, and 1C may have a width w in the range of about 5 micrometers (μm) to about 250 micrometers (μm) shown as the horizontal dimension of channel 106 in FIG. 1B, a height h in the range of about 1 micrometer (μm) to about 5 micrometer (μm) shown as the vertical dimension of channel 106 in FIGS. 1B and 1C, and a length in the range of about 17 micrometers (μm) to about 20 micrometers (μm) shown as the vertical dimension of a channel segment in FIG. 1A. An extension may be provided for a first of the channel segments to provide coupling with inlet opening 110, and an extension may be provided for a last of the channel segments to provide coupling with exit opening 130.

Channel structure 102, for example, may include at least one of gold, aluminum, titanium, and/or silicon dioxide. Moreover, channel structure 102 may define a hydrophilic surface adjacent the serpentine channel 106, and/or channel structure 102 may include at least one of a surfactant, a lubricant, and/or a desiccant adjacent the serpentine channel 106. According to some embodiments, channel structure 102 may include a gold layer lining serpentine channel 106.

Channel structure 102 may define a hydrophobic surface opposite the piezoelectric resonator substrate. Such a hydrophobic surface may surround inlet opening 110 to reduce/prevent spread of the analyte across the top surface of channel structure 102.

Figures 2A, 2B:
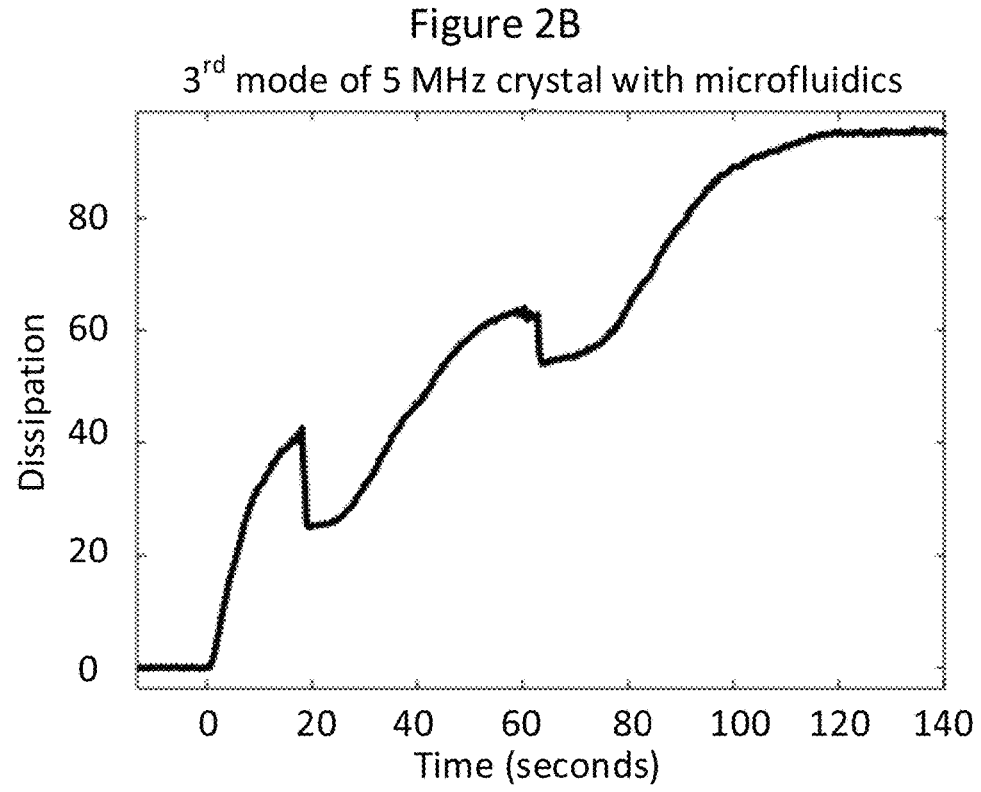
FIG. 2A-2B are graphs illustrating examples of data generated using sensors and methods across a wide shear rate range according to some embodiments of inventive concepts.

In one embodiment, the microfluidic quartz resonators of the microcapillary viscometer are not transparent, and therefore, the filling may be detected by monitoring the thickness-shear mode resonances of the quartz. Thus, filling will be measured using a non-visible method. The shear motion amplitude on the quartz resonator has a Gaussian shape with center having the highest shear motion amplitude. Therefore, high frequency/dissipation shifts in the quartz resonances occur when the fluid front moves closer to the center of the active area of the piezoelectric resonator substrate, and the high frequency/dissipation shifts are less when the fluid front approaches the edges of the active area of the piezoelectric resonator substrate shown as 151a and 151c in FIG. 2A. The longer dimensions (i.e., lengths) of the channel segments are parallel to the shear motion direction in most of the sensor. This changes the boundary condition and may create dips in dissipation as shown in FIG. 2B, shown as plateaus 161a, 161b, and 161c in FIG. 2A. These dips/plateaus can help to identify the turning points between channel segments in the channel 106 more sensitively. In one instance, the use of resonance tracking to find the capillary flow position inside the microfluidics is achieved. This can be confirmed with fluorescence microscopy imaging. It is of note that the measurement accuracy in fluorescence microscopy may be limited by the time-resolution. Generally the time-resolution of the current electronics of the quartz resonance tracking system is in the range of about 1 milliseconds to about 0.3 seconds. The time-resolution of quartz resonance tracking systems can be as low as ~1 ms. The described quartz sensor in some cases may be less sensitive when the fluid front is close to the edges of the active region, which may cause lower resolution in fluid velocity tracking and consequently higher error margins. It is generally accepted that for such low-shear-rate viscosity measured within 20% accuracy is acceptable.

As shown in FIG. 2A, the dissipation shift may have plateaus 161a, 161b, and 161c at periods of time when a fluid front of the analyte in the channel 106 is moving at/near an edge of the active region, which corresponds to a respective transition from one channel segment to a next channel segment. For example, plateau 161a corresponds to period of time that the fluid front 151a is at/near a transition from the first channel segment to the second channel segment as indicated by the inset on the left side of FIG. 2A, and plateau 161c corresponds to a period of time that the fluid front 151c is at/near a transition from the third channel segment to fourth channel segment as indicated by the inset on the right side of FIG. 2A. While a separate inset corresponding to plateau 161b is not provided, plateau 161b corresponds to a period of time that the fluid front is at/near a transition from the second channel segment to the third channel segment.

Some embodiments of inventive concepts are directed towards a sensor comprising a resonator, the resonator having a front surface and back surface, at least one structure comprising at least one channel where at least one structure is disposed on at least one of the front surface and back surface; and where the at least one structure of at least one channel is configured to serve as a conduit for a media to be analyzed.

Further, some embodiments of inventive concepts are directed towards a method of operating a sensor for measuring a media comprising driving a resonator at a driving amplitude and frequency such that a structure on a surface of the resonator confers the resonance to a media within the structure to be sensed, measuring the filling time of the structure acoustically, measuring a dissipation and frequency response of the resonator, and determining a material property of the media to be sensed based on the measured at least one of the filling time, dissipation and frequency response.

In yet a further instance, some embodiments of inventive concepts are directed to a method for determining the rheological properties of a protein sample, the method comprising placing a protein sample within a MQR device, exciting the protein sample with acoustic energy, measuring the interaction of the protein sample with the structure by monitoring the acoustic energy, calculating changes in the acoustic energy, determining at least one rheological property of the protein sample where the protein sample is stable at high concentration.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B (or, equivalently, "at least one of A or B," or, equivalently "at least one of A and/or B') can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one. B (and optionally including other elements); etc.

It should also be understood that, unless clearly indicated to the contrary, in any methods claimed herein that include more than one operation or act, the order of the operations or acts of the method are not necessarily limited to the order in which the operations or acts of the method are recited.

In the claims, as well as in the specification above, all transitional phrases such as "comprising", "including", "carrying", "having", "containing", "involving," "holding", "composed of", and the like are to be understood to be open-ended. i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

Some embodiments herein describe a sensor 101 and its methods of use across a wide shear rate range. FIG. 1A depicts one embodiment showing a top view of a microfluidic sensor 101, fabricated on a quartz substrate 100, having an active sensing area defined between electrodes 108 and 120 (on opposite sides of substrate 100), an aluminum channel structure 102 defining a microfluidic channel 106, and having a sample inlet opening 110, a direction of shear motion 112 and an exit opening 130. FIG. 1B shows a cross sectional side view of one embodiment of the microfluidic sensor 101 of FIG. 1A taken at location 140, looking into a single channel segment of the serpentine microfluidic channel 106 on quartz substrate (100), with a metal layer, for instance aluminum or gold, providing a first electrode 108 and a direction of shear motion (112) and another metal layer providing a second electrode 120. FIG. 1C shows an alternative cross sectional side view of microfluidic channel 106 on quartz substrate 100 of FIG. 1A taken at location 140, including aluminum channel structure 102, a media (also referred to as an analyte or sample) to be analyzed in channel 106 and the direction of shear motion 112. The cross sectional view of FIG. 1B is taken in a direction perpendicular to the channel segment at location 140 of FIG. 1A, and the cross sectional view of FIG. 1C is taken in a direction parallel to the channel segment at location 140 of FIG. 1A. In practice, a drop of the analyte to be analyzed would be placed on the sample inlet opening (110). Electrical lead 104a may provide electrical coupling with electrode 120, and electrical lead 104b may provide electrical coupling with electrode 108.

FIG. 2A illustrates use of sensor 101 and its methods of use across a wide shear rate range at 5 MHz. In this example, a flow profiles through capillary channel 106 is depicted where media position (i.e., a position of a fluid front of the media/analyte) can be mapped versus time to determine viscosity at a low shear rate. Further in this example, the amplitude of the dissipation shift (206) is used in determining the viscosity at a high shear-rate. The capillary filling of the microfluidic channels is observed by tracking the resonances of the quartz sensor and, knowing the channel dimensions, the position vs. time information can be converted to viscosity at low shear-rates (e.g., about 100 l/s to about 10,000 l/s). The dissipation of the resonance modes can be converted to viscosity at very high shear-rates. This simultaneous, dual-range viscosity measurement may be important/critical to determine rheological properties of non-Newtonian fluids.

Figures 1, 3A:
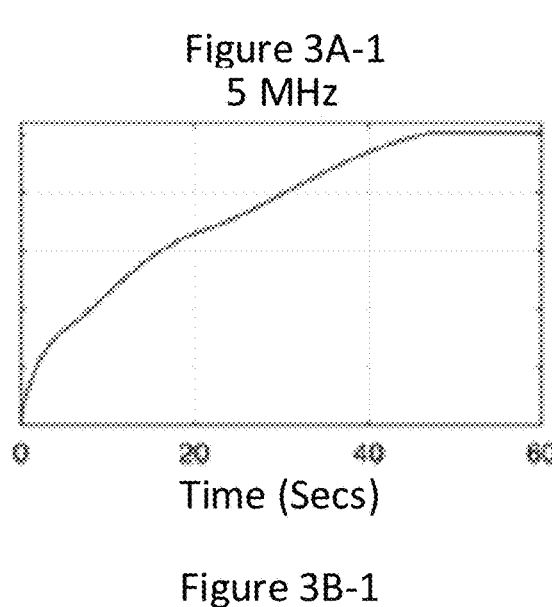
FIGS. 3A-1 and 3A-2 respectively illustrate simulation and experimental responses of a capillary quartz sensor to a sample of 40% w glycerol at 5 MHz according to some embodiments of inventive concepts.
Figures 2, 3A:
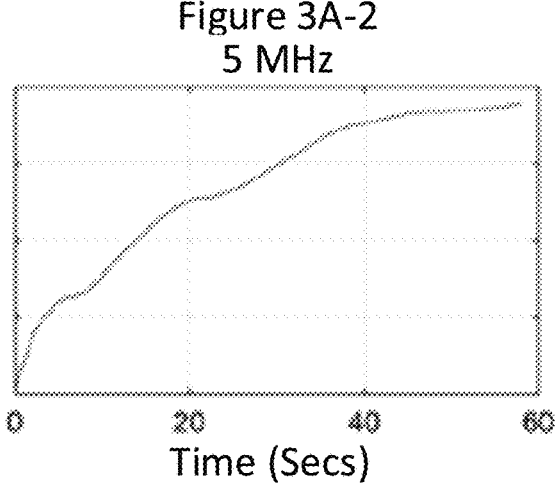
Figures 1, 3B:
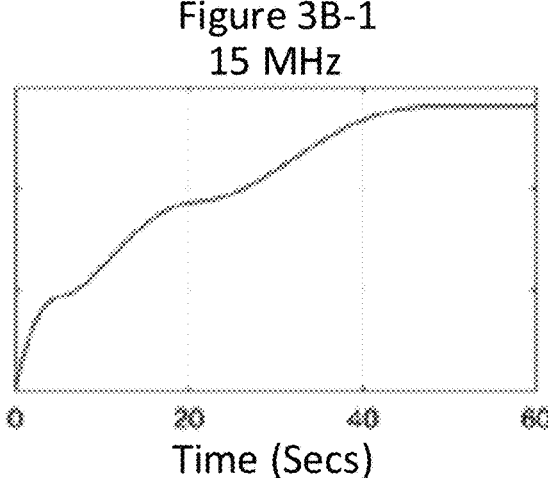
Figures 2, 3B:
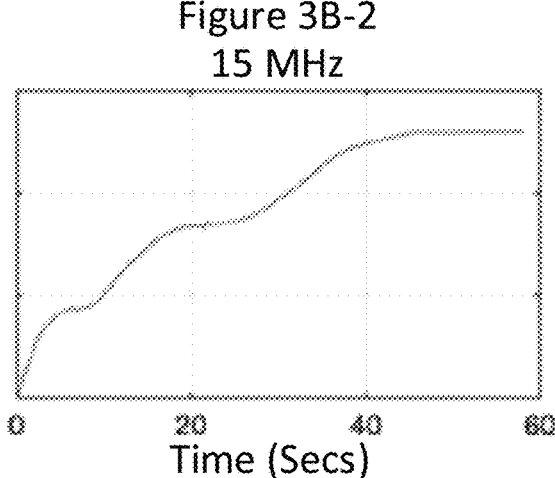

FIGS. 3A-1 and 3A-2 show the simulated and actual response of the sensor 101 to a sample of 40% wt/wt glycerol at 5 MHz, respectively. FIGS. 3B-1 and 3B-2 show the simulated and actual response of the sensor 101 to a sample of 40% wt/wt glycerol at 15 MHz, respectively.

Figures 1, 3C:
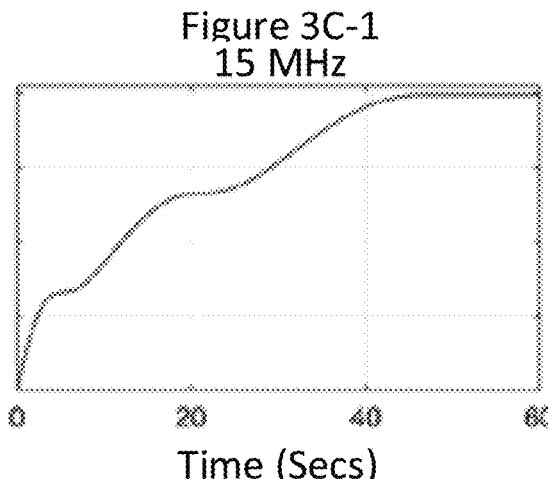
Figures 2, 3C:
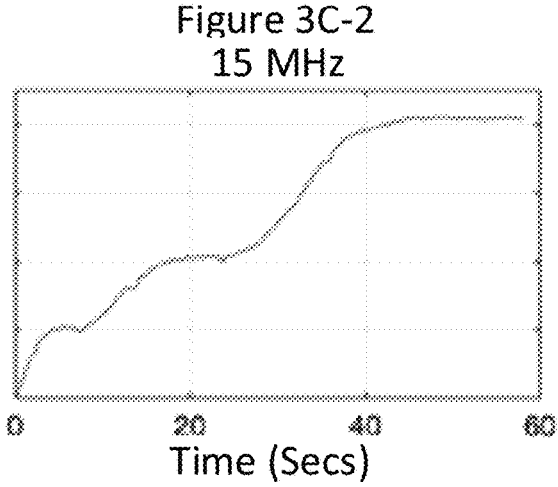

FIGS. 3C-1 and 3C-2 show the simulated and actual response of the sensor 101 to a sample of 40% wt/wt glycerol at 25 MHz, respectively.

Figure 4A:
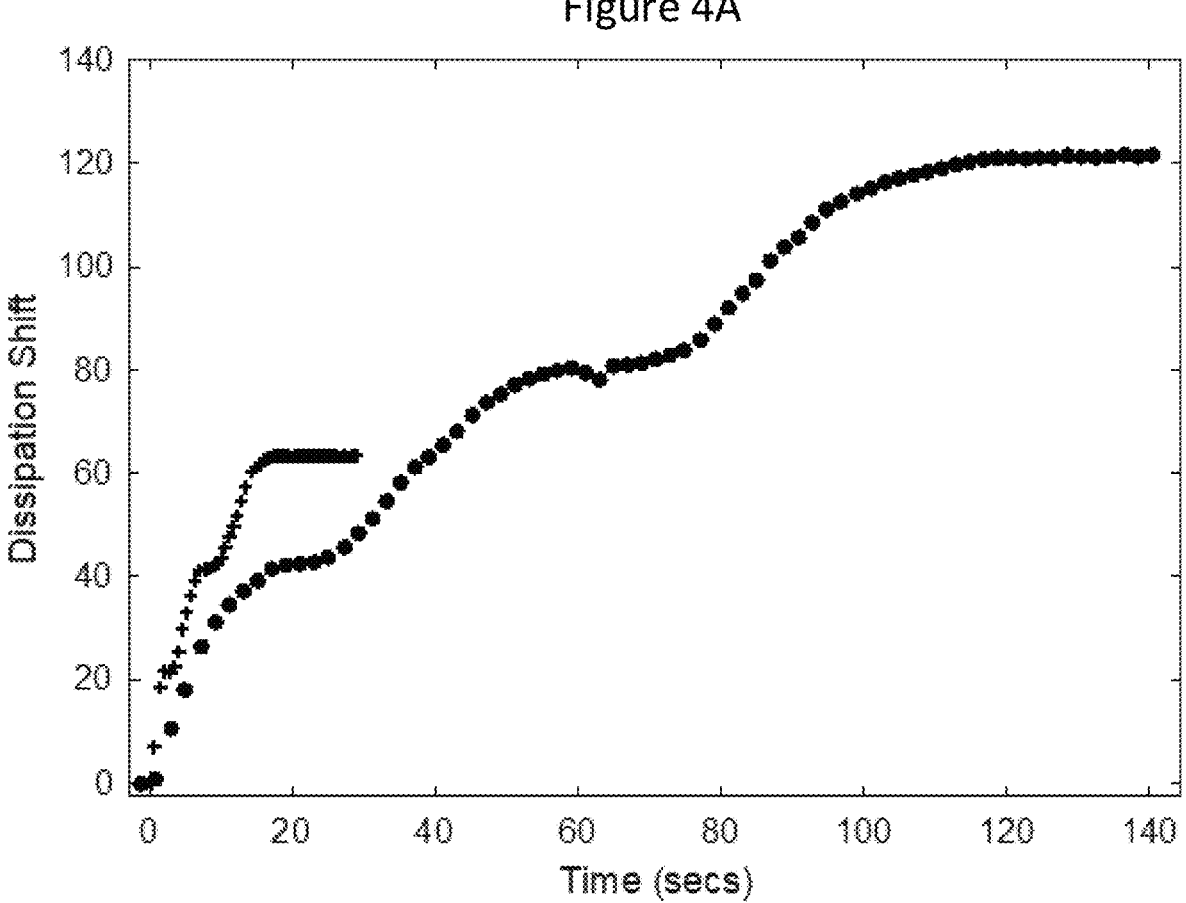
FIG. 4A illustrates the response of a capillary quartz sensor to a sample of water and BSA according to some embodiments of inventive concepts.

FIG. 4A shows the contrast in filling time and dissipation amplitude for water (plus symbols) and 200 mg/ml bovine serum albumin (BSA, filled circles).

Figure 4B:
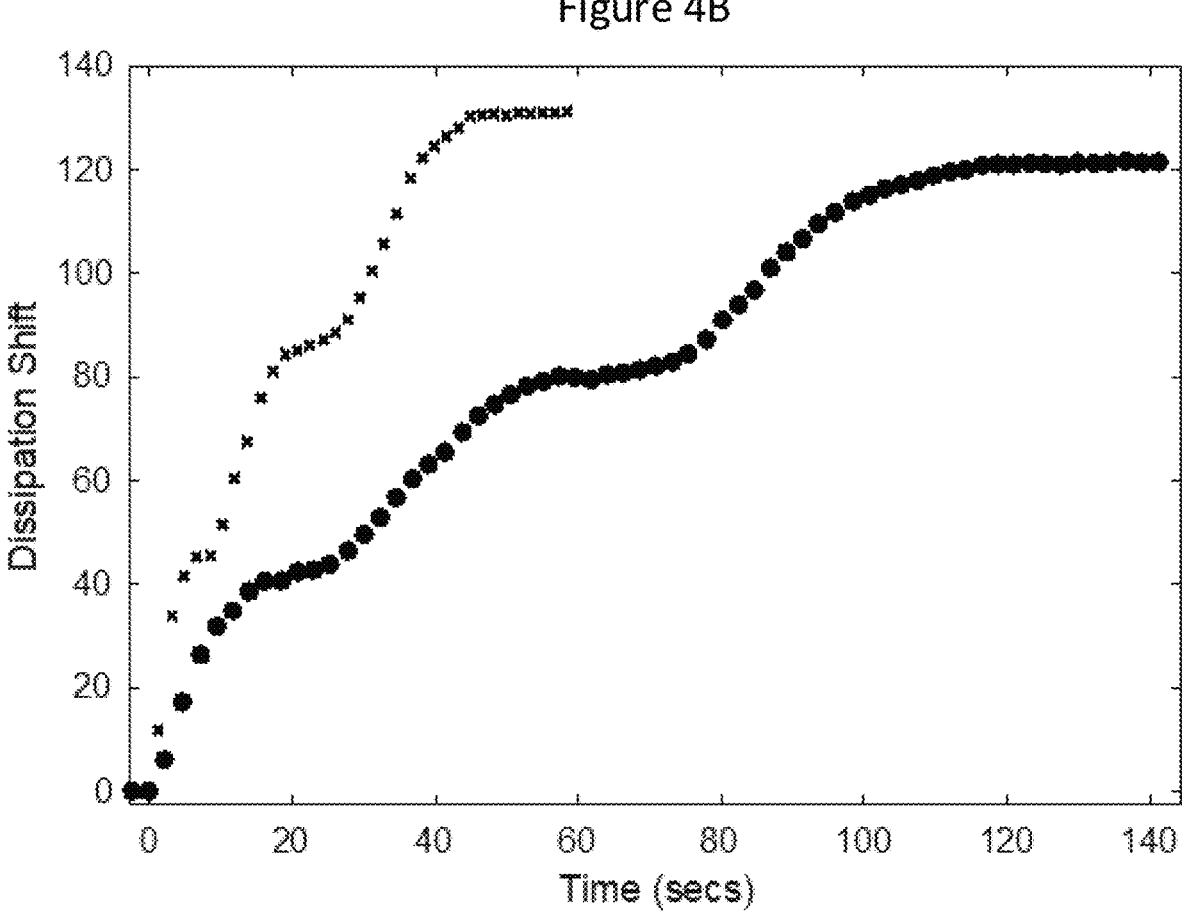
FIG. 4B illustrates the response of a capillary quartz sensor to a sample of BSA and aqueous glycerol mixture according to some embodiments of inventive concepts.

FIG. 4B shows the contrast in filling time and dissipation amplitude is similar for 200 mg/ml bovine serum albumin (BSA, filled circles) and 40% w. glycerol/water (crosses). While the dissipation shift amplitude is similar for the BSA and glycerol, the filling time for the BSA is significantly longer.

Figure 5A:
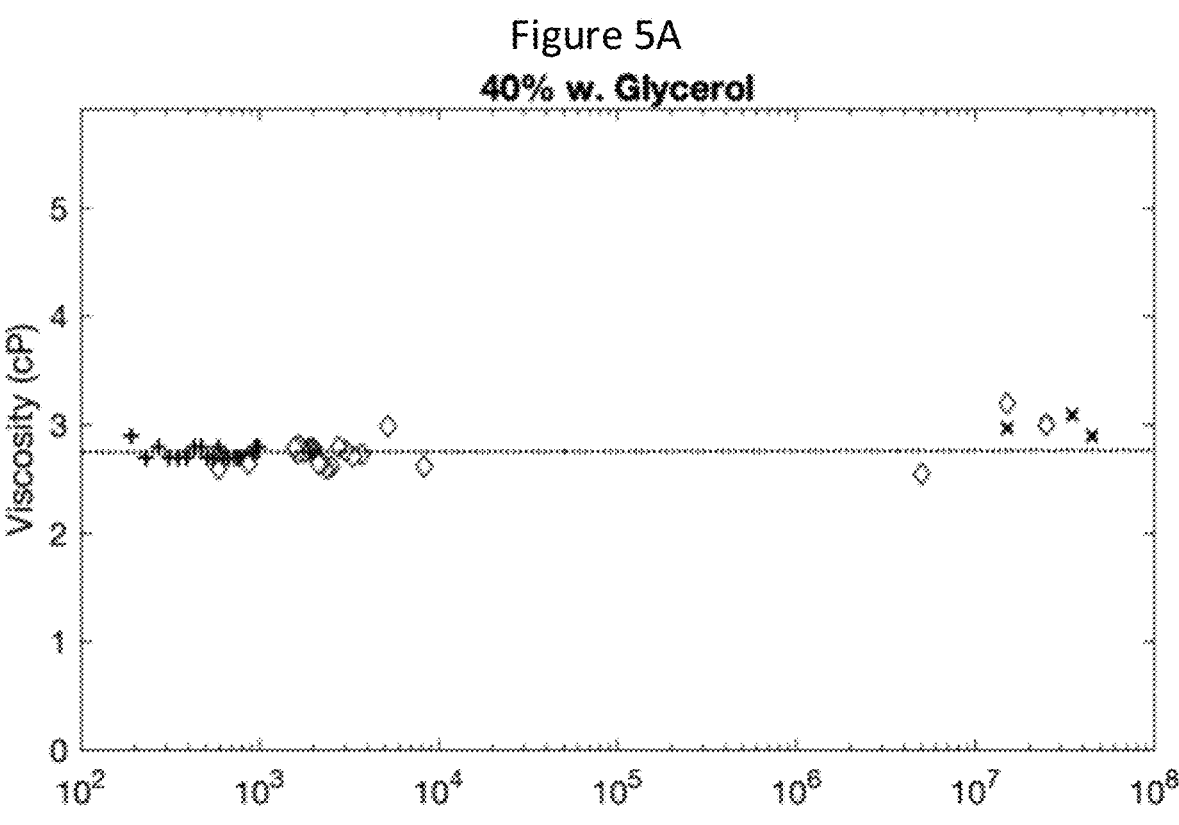
FIG. 5A illustrates viscosity measurements using a capillary quartz sensor to measure a sample of 40% w. glycerol and how these measurements compare with rotational rheometry and quartz crystal microbalance according to some embodiments of inventive concepts.
Figure 5B:
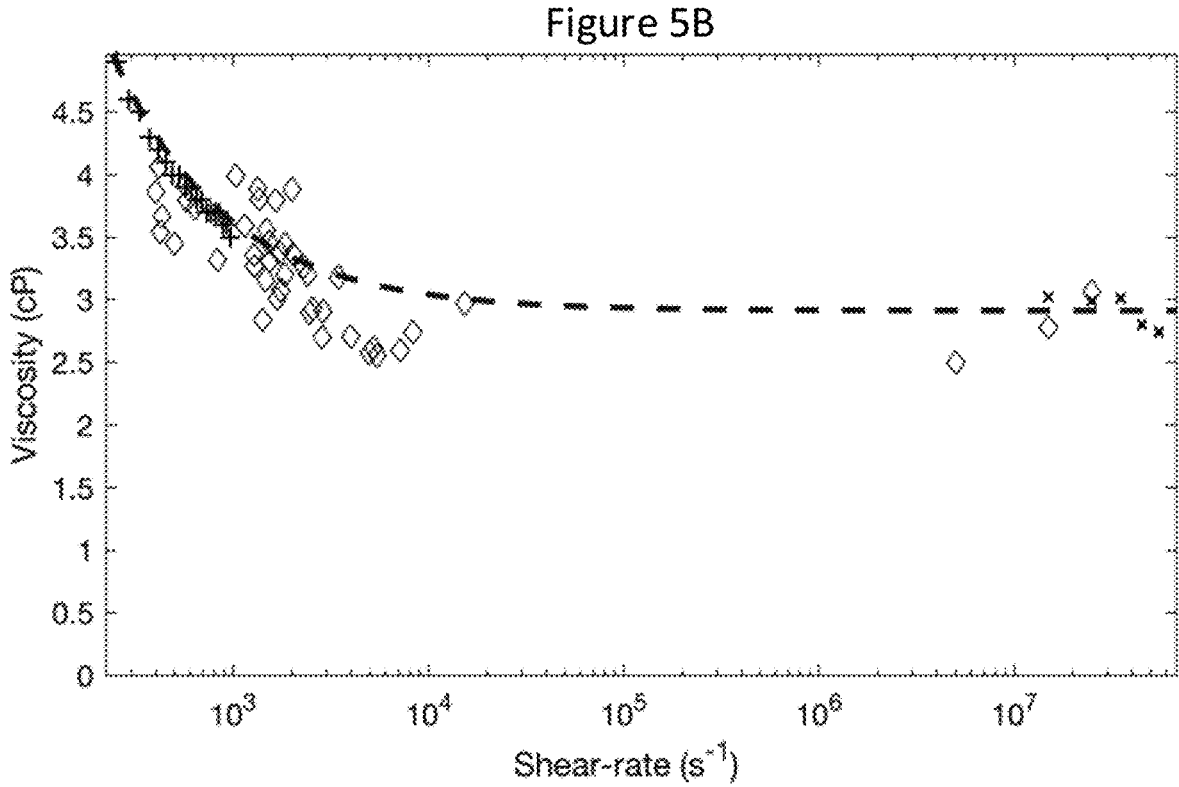
FIG. 5B illustrates viscosity measurements using a capillary quartz sensor to measure a sample of 200 mg/ml BSA in PBS and how these measurements compare with rotational rheometry and quartz crystal microbalance according to some embodiments of inventive concepts.

FIGS. 5A and 5B further illustrate viscosity measurements for 40% w. glycerol/water and 200 mg/ml BSA comparing rotational rheometer (plusses), conventional QCM (crosses), and sensors/methods according to some embodiments of present inventive concepts (diamonds).

Figure 6:
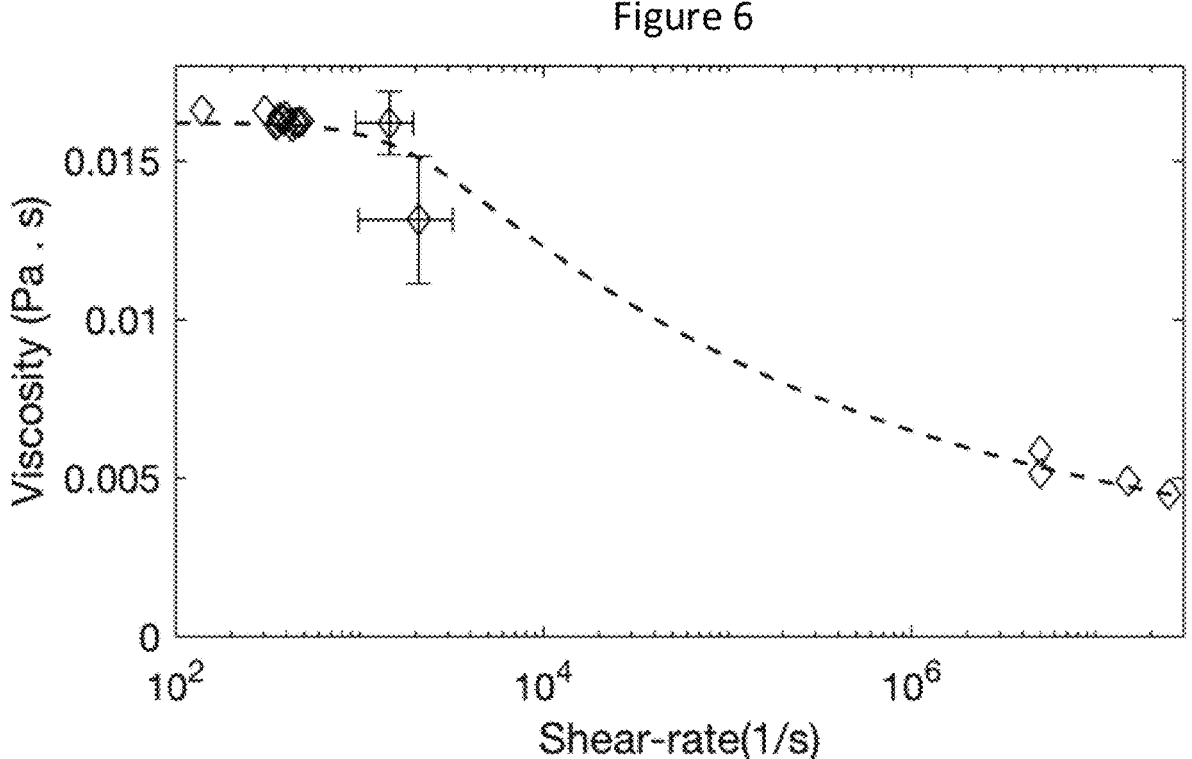
FIG. 6 illustrates viscosity measurements obtained using a capillary quartz sensor to measure samples of IgG at 200 mg/mL according to some embodiments of inventive concepts.

FIG. 6 further illustrates viscosity measurement for 200 mg/ml IgG according to some embodiments of inventive concepts. As described, the system can be used for the viscosity characterization by microcapillary quartz resonator of injectability. In some embodiments, this would use a Carreau-model with two plateaus and cut-off, as illustrated by applying the known data points to solve the Carreau-model equation for the rest of the curve.

Example Embodiments are discussed below.

Example Embodiment 1. A sensor 101 comprising:

an acoustic wave actuator (e.g., provided using piezoelectric resonator substrate 101 and electrodes 108 and 120), said actuator having a front surface and back surface;

an at least one structure 102 comprising at least one channel 106 wherein said at least one structure 102 is disposed on at least one of said front surface and back surface; and wherein said at least one structure 102 of at least one channel 106 is configured to serve as a conduit for an analyte (also referred to as a media or sample) to be analyzed.

Example Embodiment 2. The sensor of example embodiment 1, wherein the acoustic wave actuator (also referred to as an acoustic wave generator) is a shear-wave generating AT-cut quartz crystal resonator.

Example Embodiment 3. The sensor of example embodiment 1, wherein said sensor 101 comprises at least one channel disposed on each of said front surface and back surface.

Example Embodiment 4. The sensor comprising at least one channel of example embodiment 1, wherein said at least one channel 106 has a defined channel height h and channel width w defining a channel aspect ratio (i.e., channel aspect ratio=h/w).

Example Embodiment 5. The sensor comprising the at least one channels of example embodiment 4, wherein said channel aspect ratio is in the range of 1 to 200.

Example Embodiment 6. The sensor comprising at least one channel of example embodiment 1, wherein the width w of the at least one channel is between 5 and 250 μm (micrometer).

Example Embodiment 7. The sensor comprising at least one channel of example embodiment 1, wherein the length of the at least one channel 106 (from inlet opening 110 to exit opening 130 and including the plurality of channel segments) is between 2 mm (millimeters) and 100 mm (millimeters).

Example Embodiment 8. The sensor comprising at least one channel of example embodiment 1, wherein said at least one channel 106 has a serpentine shape with between 1-12 u-turns (between channel segments) along the at least one channel's length.

Example Embodiment 8. The sensor comprising at least one channel of example embodiment 1, wherein the at least one channel comprises a width of in the range of about 5 μm (micrometers) to about 250 μm (micrometers), a height in the range of about 1 μm (micrometers) to about 5 μm, (micrometers) and a length of about 18.3 mm (millimeters).

Example Embodiment 9. The sensor of example embodiment 1, wherein said disposition of said at least one channel 106 on at least one of said front surface or back surface forms an interface between said structures and wherein said interface includes at least one of aluminum, gold, and silicon dioxide.

Example Embodiment 10. The sensor of example embodiment 1, wherein the structure 102 including the at least one channel 106 has an outer surface opposite substrate 100 and an inner surface adjacent the at least one channel 106 and where said inner surface adjacent the at least one channel 106 can be treated with at least one of a surfactant, a lubricant, a hydrophilic material, a hydrophobic material, and/or a desiccant.

Example Embodiment 11. The sensor of example embodiment 10, wherein said outer surface of the structure 102 (opposite substrate 100) can be treated with at least one of a polysiloxane, a perfluorinated acid capable of forming a self-assembled monolayer, and/or a fluorinated material.

Example Embodiment 12. The sensor of example embodiment 10, wherein said inner surface adjacent the at least one channel 106 is coated with a perfluorinated hydrocarbon including oxygen-substituted hydrocarbons that are monomeric or polymeric in nature having an actual or number average molecular weight of 100 to 1,000,000.

Example Embodiment 13. The sensor of example embodiment 1, wherein said at least one channel comprises a channel 106 having;

an inlet opening 110 allowing ingress of the analyte into said channel;

a channel length configured to be filled with said analyte, and;

an exit opening 130 allowing egress of the analyte from said channel 106 thus forming an analyte flow path.

Example Embodiment 14. The sensor of example embodiment 1, wherein said at least one channel comprises a channel 106 having;

an inlet opening 110 allowing ingress of the analyte into said channel 106;

wherein said channel 106 has a defined channel height h and channel width w;

wherein said channel has a length in the range of about 1 mm (millimeter) to about 20 mm (millimeter);

wherein said channel 106 has at least 1 u-turn; and where said channel height h and channel width w serve to limit ingress into said channel of components of the analyte substantially greater than said channel height and/or channel width.

Example Embodiment 15. A method of operating a sensor 101 for measuring an analyte (also referred to as a media or sample) to be sensed, the method comprising:

driving an acoustic wave generator (e.g., provided using piezoelectric resonator substrate 101 and electrodes 108 and 120) at a driving amplitude and frequency such that a structure 102 on a surface of the acoustic wave generator confers the acoustic wave to the analyte to be sensed within said structure 102;

acoustically measuring a filling time of the analyte in the structure 102;

measuring a dissipation and frequency response of the acoustic wave; and determining a material property of the analyte to be sensed based on the measured at least one of the filling time, the dissipation, and/or the frequency response.

Example Embodiment 16. The method of example embodiment 15, wherein said material property of the analyte includes at least one of density, viscosity, plastic viscosity, flow, and/or differential viscosity.

Example Embodiment 17. The method of example embodiment 15, wherein the driving frequency is in the range of about 1 MHz (megahertz) to about 5000 MHz (megahertz).

Example Embodiment 18. The method of example embodiment 15, further comprising:

heating the analyte to be sensed to a predetermined temperature before measuring the at least one of the dissipation and the frequency response.

Example Embodiment 19. The method of example embodiment 15, further comprising:

determining the presence of a component in the analyte to be sensed by comparing peaks of the measured dissipation response as a function of driving amplitude and driving frequency to known dissipation spectra based on the driving amplitude and the driving frequency.

Example Embodiment 20. A method for determining rheological properties of an analyte (e.g., a protein sample), the method comprising:

a. placing the analyte within a channel structure 102 of a microfluidic quartz resonator (MQR) device (e.g., provided as discussed above with respect to FIGS. 1A, 1B, and 1C);

b. exciting the analyte with acoustic energy:

c. measuring concurrently:

i. a position of a fluid front of the analyte within the channel structure 102 of the MQR device as a function of time; and, ii. an interaction of the analyte with the channel structure 102 by monitoring the acoustic energy;

d. calculating concurrently:

i. a fill rate of the analyte in the channel structure 102 of the MQR device; and, ii. changes in the acoustic energy, e. determining at least one rheological property of the analyte, wherein the analyte is stable at high concentration.

Example Embodiment 21. The method of example embodiment 20, wherein the fill rate of the analyte in the channel structure 102 of the MQR device is used to determine viscosity in the range of about 20 $s^{-1}$ (l/s) to about 40.000 $s^{-1}$ (l/s).

Example Embodiment 22. The method of example embodiment 20, wherein an amplitude of changes in acoustic energy of the MQR device is used to determine viscosity of the analyte at a shear rate above about 1,000,000 $s^{-1}$ (l/s).

Example Embodiment 23. The method of example embodiment 20, wherein the analyte is an antigen-binding protein.

Example Embodiment 24. The method of example embodiment 23, wherein the antigen-binding protein is an antibody, an antibody fragment, and/or a receptor-Fc-fusion protein.

Example Embodiment 25. The method of example embodiment 23, wherein the antigen-binding protein is a human monoclonal antibody.

Example Embodiment 26. The method of example embodiment 20, wherein the analyte comprises a protein sample is in the analyte at a concentration in the range of about 1 μg/mL (micrograms/milliliter) to about 500 mg/mL (micrograms/milliliter).

Example Embodiment 27. The method of example embodiment 20, wherein the acoustic energy is measured at multiple frequencies in the range of about 1 MHz to about 200 MHz.

Example Embodiment 28. The method of example embodiment 20 further comprising repeating operations (a)-(e) using a different concentration of a protein in the analyte.

Example Embodiment 29. The method of example embodiment 20 further comprising repeating operations (a)-(e) using a different concentration of salt in the analyte.

Example Embodiment 30. The method of example embodiment 20 further comprising repeating operations (a)-(e) using a different pH of the analyte.

Example Embodiment 31. The method of example embodiment 20 further comprising repeating operations (a)-(e) using a different temperature.

Figure 7:
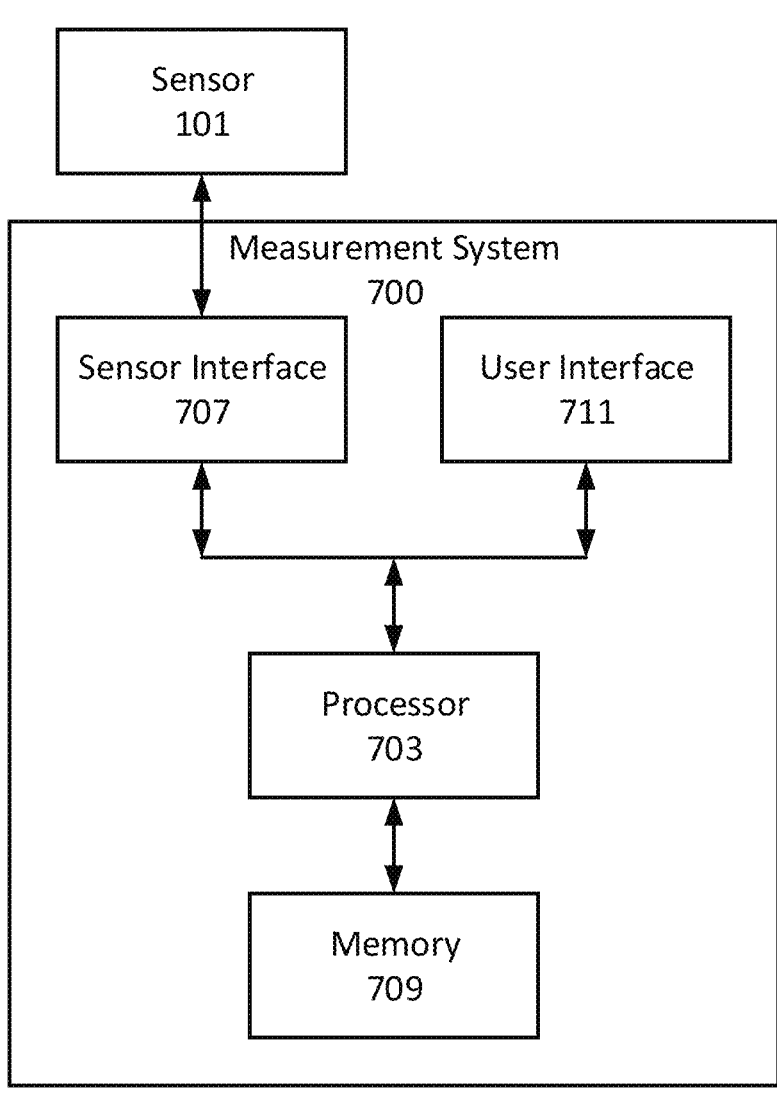
FIG. 7 is a block diagram illustrating a measurement system according to some embodiments of inventive concepts.

FIG. 7 is a block diagram illustrating a measurement system 700 for measuring properties of a fluid analyte using a sensor as discussed above, for example, with respect to FIGS. 1A, 1B, and 1C. As shown, the system may include processor 703 (also referred to as processing circuitry), sensor 101 (e.g., a sensor as discussed above with respect to FIGS. 1A, 1B, and 1C), a sensor interface 707 (e.g., providing a detachable or permanent mechanical and electrical coupling between processor 703 and sensor 707), and memory 709 (also referred to as memory circuitry) coupled with processor 703. System 700 may also include user interface 711 coupled with processor 703, wherein user interface 711 is configured to accept user input and/or provide output.

The memory 709 may include computer readable program code that when executed by the processor 703 causes the processor 703 and/or system 700 to perform operations according to embodiments disclosed herein. According to other embodiments, processor 703 may be defined to include memory so that separate memory is not required. For example, modules may be stored in memory 709, and these modules may provide instructions so that when instructions of a module are executed by processor 703, processor 703 performs respective operations (e.g., operations discussed below with respect to the flow charts of FIGS. 8 and 9).

In general, sensor interface 707 may provide electrical coupling between processor 703 and leads 104a and 104b of sensor 101 so that processor 793 can apply an electrical signal to leads 104a and 104b to drive the active area of substrate 101 at a driving amplitude and frequency to generate acoustic waves and/or shear motion in the direction 112 of shear motion. Processor 703 can also monitor leads 104a and 104b to determine dissipations, frequency responses, filling times, resonances, shifts in resonances, and/or other parameters used to determine a property (e.g., density, viscosity, plastic viscosity, differential viscosity, flow, low shear-rate viscosity, high shear-rate viscosity, etc.) of the analyte.

According to embodiments where sensor interface 707 may provide a detachable coupling for sensor 705, the sensor 705 may be considered as being outside of measurement system 700 as shown in FIG. 7, and different sensors having different characteristics may be used with the same sensor system. For example, different sensors may have one or more of different channel lengths, different channel widths, different channel heights, different channel aspect ratios, different channel segment lengths, different channel surfaces, different active area sizes, etc. to accommodate measurement of different analytes having different properties (e.g., one or more of different viscosities, different densities, different particle sizes, etc.). According to embodiments where sensor interface 707 provides a permanent coupling for sensor 705, the sensor 705 may be considered as being an internal component of measurement system 700.

Operations of the measurement system 700 (implemented using the structure of the block diagram of FIG. 7) will now be discussed with reference to the flow chart of FIG. 8 according to some embodiments of inventive concepts. For example, modules may be stored in memory 709 of FIG. 7, and these modules may provide instructions so that when the instructions of a module are executed by processor 703, processor 703 performs respective operations of the flow chart. For example, operations of FIG. 8 may be used to measure viscosity of an analyte using microfluidic piezoelectric sensor 101 including channel 106 on an active area of piezoelectric resonator substrate 100. As a preliminary operation, a user may place a sample of the analyte on inlet opening 110, and capillary action of channel 106 may draw the analyte from inlet opening 110 into channel 106.

According to some embodiments at block 803, processor 703 drives the microfluidic piezoelectric sensor (e.g., by providing/generating a driving electrical signal at a driving amplitude and a driving frequency through sensor interface 707 and leads 104a and 104b) so that the active area of the piezoelectric resonator substrate 100 generates shear motion in the direction 112 of shear motion displacement that is parallel with respect to a first surface of the piezoelectric resonator substrate 100. For example, the microfluidic piezoelectric sensor resonator may be driven so that the active area of the piezoelectric resonator substrate 100 generates shear motion at a frequency in the range of about 1 MHz to about 5,000 MHz.

According to some embodiments at block 809, processor 703 determines a high shear-rate viscosity of the analyte based on a shift in resonance of the microfluidic piezoelectric sensor 101 while driving the microfluidic piezoelectric sensor with the analyte in the channel 106. For example, processor 703 may determine the high shear-rate viscosity by measuring a shift in resonance frequency and a dissipation of the microfluidic piezoelectric sensor. Moreover, the shift in resonance may be a shift in resonance spectrum and/or a shift in resonance frequency and dissipation.

According to some embodiments at block 815, processor 703 determines a low shear-rate viscosity of the analyte by detecting flow of the analyte through the channel 106 based on tracking shifts in resonance of the microfluidic piezoelectric sensor 101. For example, processor 703 may determine the low shear-rate viscosity of the analyte by measuring shifts in resonance frequency and a dissipation of the microfluidic piezoelectric sensor. Moreover, the shifts in resonance may be shifts in resonance spectrum and/or shifts in resonance frequency and dissipation.

As discussed above with respect to FIGS. 1A, 1B, and 1C, the piezoelectric resonator substrate 100 may have the first surface and a second surface with a first electrode 108 (electrically coupled with lead 104b) on the first surface of the piezoelectric resonator substrate and a second electrode 120 (electrically coupled with lead 104a) on the second surface of the piezoelectric resonator substrate. Moreover, the active area of the piezoelectric resonator substrate 100 may be defined between the first electrode and the second electrode so that the active area of the piezoelectric resonator substrate is configured to generate the shear motion in the direction 112 of shear motion displacement that is parallel with respect to the first surface responsive to processor 703 driving the sensor as discussed above with respect to operation 803.

As further discussed above with respect to FIGS. 1A, 1B, and 1C, the channel 106 may be a serpentine channel defined by a channel structure 102 on the first surface of the piezoelectric resonator substrate 100. The serpentine channel may include a plurality of channel segments connected in series, and at least portions of the plurality of channel segments are on the active area of the piezoelectric resonator substrate. Each of the plurality of channel segments may be a linear channel segment that is parallel with respect to the direction 112 of shear motion displacement. Moreover, processor 703 may determine the low shear-rate viscosity at operation 815 by detecting flow of the analyte through the channel based on tracking shifts in resonance of the microfluidic piezoelectric sensor due to a fluid front of the analyte reaching respective ends of the channel segments. Further detail of a microfluidic piezoelectric sensor 101 that may be used with measurement system 700 are discussed above with respect to FIGS. 1A, 1B, and 1C.

Operations of the measurement system 700 (implemented using the structure of the block diagram of FIG. 7) will now be discussed with reference to the flow chart of FIG. 9 according to some embodiments of inventive concepts. For example, modules may be stored in memory 709 of FIG. 7, and these modules may provide instructions so that when the instructions of a module are executed by processor 703, processor 703 performs respective operations of the flow chart. For example, operations of FIG. 9 may be used to measure an analyte using sensor 101 of FIGS. 1A, 1B, and 1C, where substrate 100 and electrodes 108 and 120 define an acoustic wave generator and structure 102 on a surface of the acoustic wave generator defines the channel 106. As a preliminary operation, a user may place a sample of the analyte on inlet opening 110, and capillary action of channel 106 may draw the analyte from inlet opening 110 into channel 106.

According to some embodiments at block 901, processor 703 may heat the analyte before performing measurements relating to dissipation response and/or frequency response (e.g., before performing measurements discussed below with respect to operation 915). While shown before operation 903, operation 901 may be performed after operation 909 and before operation 915.

According to some embodiments at block 903, processor 703 drives the acoustic wave generator at a driving amplitude and a driving frequency (e.g., by providing/generating a driving electrical signal at a driving amplitude and a driving frequency through sensor interface 707 and leads 104*a* and 104*b*) such that the structure 102 on the surface of the acoustic wave generator confers an acoustic wave to the analyte within the structure 102. For example, the driving frequency may be in the range of about 1 MHz to about 5,000 MHz.

According to some embodiments at block 909, processor 703 measures a filling time acoustically, where the filling time is a time to fill the structure 102 (e.g., to fill a portion of channel 106 of structure 102) with the analyte while driving the acoustic wave generator at the driving amplitude and the driving frequency.

According to some embodiments at block 915, processor 703 measures at least one of a dissipation response and a frequency response of the acoustic wave with the analyte in the structure 102 while driving the acoustic wave generator at the driving amplitude and the driving frequency.

According to some embodiments at block 921, processor 703 determines a material property of the analyte based on measuring at least one of the filling time, the dissipation response, and the frequency response. Moreover, the material property of the analyte may include at least one of density, viscosity, plastic viscosity, and differential viscosity. For example, processor 703 may determine the material property of the analyte by determining a presence of a component in the analyte by comparing peaks of the dissipation response as a function of the driving amplitude and the driving frequency to a known dissipation spectra based on the driving amplitude and the driving frequency.

Figures 8, 9:
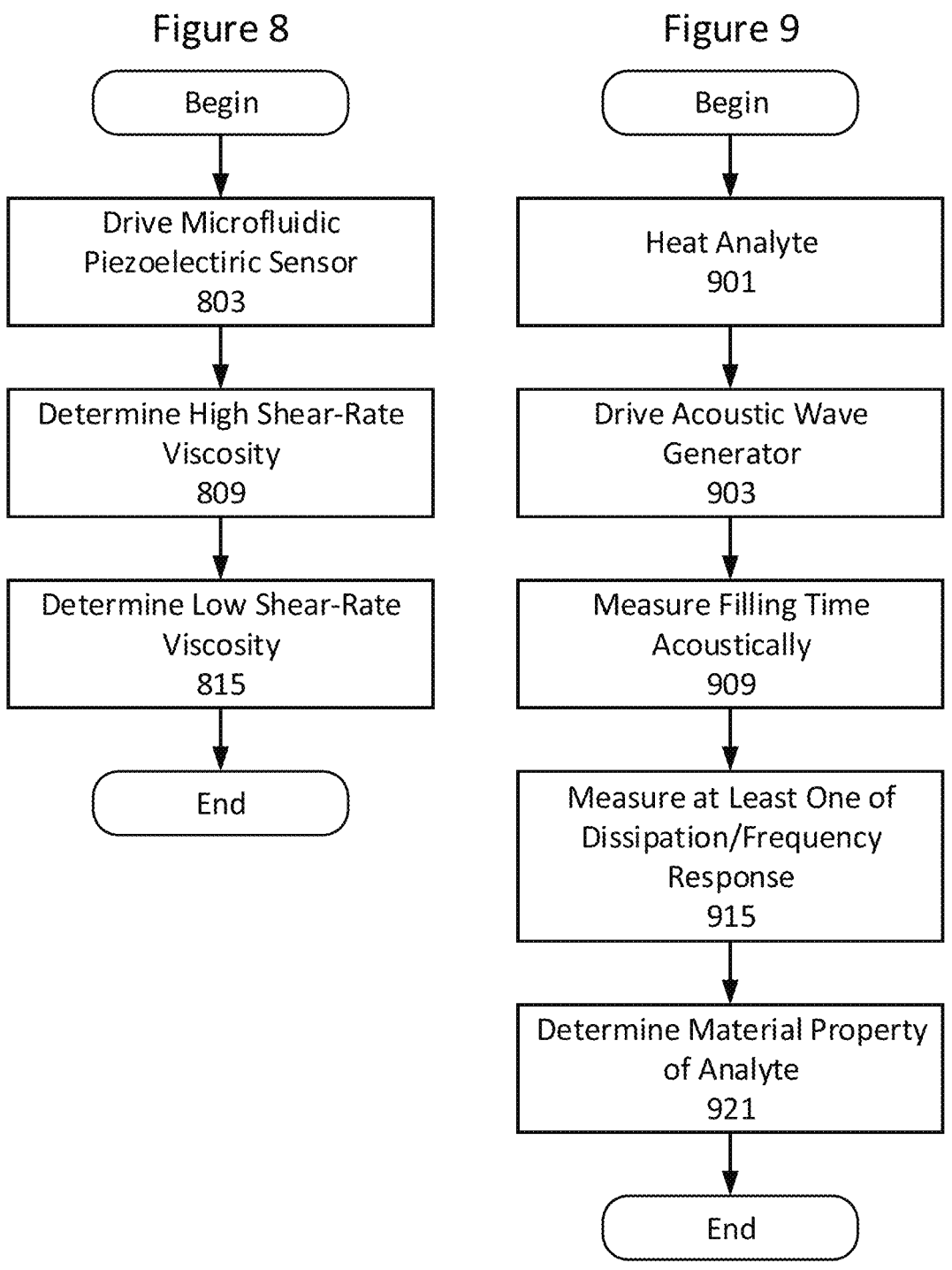
FIGS. 8 and 9 are flow charts illustrating operations of the measurement system of FIG. 7 according to some embodiments of inventive concepts.

In methods of either of FIG. 8 or 9, processor 703 may provide output of intermediate/final results/measurements, etc. through user interface 711. For example, user interface 711 may include a graphical display (e.g., a computer screen) that can be used to display and intermediate/final result/measurement such as dissipation, frequency response, filling time, resonance, shift in resonance frequency, density, viscosity, plastic viscosity, differential viscosity, flow, low shear-rate viscosity, high shear-rate viscosity, shifts in resonance spectrum, dissipation response, frequency response. Such a display may also be used to one or more graphs related to such results/measurements such as a graph discussed above with respect to any of FIGS. 2A, 2B, 3A1-2, 3B1-2, 3C1-2, 4A, 4B, 5A, 5B, and/or 6.

In the above-description of various embodiments of present inventive concepts, it is to be understood that the terminology used herein is for the purpose of describing particular embodiments only and is not intended to be limiting of present inventive concepts. Unless otherwise defined, all terms (including technical and scientific terms) used herein have the same meaning as commonly understood by one of ordinary skill in the art to which present inventive concepts belong. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

When an element is referred to as being "connected", "coupled", "responsive", or variants thereof to another element, it can be directly connected, coupled, or responsive to the other element or intervening elements may be present. In contrast, when an element is referred to as being "directly connected", "directly coupled", "directly responsive", or variants thereof to another element, there are no intervening elements present. Like numbers refer to like elements throughout. Furthermore, "coupled", "connected", "responsive", or variants thereof as used herein may include wirelessly coupled, connected, or responsive. As used herein, the singular forms "a", "an" and "the" are intended to include the plural forms as well, unless the context clearly indicates otherwise. Well-known functions or constructions may not be described in detail for brevity and/or clarity. The term "and/or" includes any and all combinations of one or more of the associated listed items.

It will be understood that although the terms first, second, third, etc. may be used herein to describe various elements/operations, these elements/operations should not be limited by these terms. These terms are only used to distinguish one element/operation from another element/operation. Thus, a first element/operation in some embodiments could be termed a second element/operation in other embodiments without departing from the teachings of present inventive concepts. The same reference numerals or the same reference designators denote the same or similar elements throughout the specification.

As used herein, the terms "comprise", "comprising", "comprises", "include", "including", "includes", "have", "has", "having", or variants thereof are open-ended, and include one or more stated features, integers, elements, steps, components or functions but does not preclude the presence or addition of one or more other features, integers, elements, steps, components, functions or groups thereof. Furthermore, as used herein, the common abbreviation "e.g.", which derives from the Latin phrase "exempli gratia," may be used to introduce or specify a general example or examples of a previously mentioned item, and is not intended to be limiting of such item. The common abbreviation "i.e.", which derives from the Latin phrase "id est," may be used to specify a particular item from a more general recitation.

The dimensions of elements in the drawings may be exaggerated for the sake of clarity. Further, it will be understood that when an element is referred to as being "on" another element, the element may be directly on the other element, or there may be an intervening element therebetween. Moreover, terms such as "top," "bottom," "upper," "lower," "above," "below," and the like are used herein to describe the relative positions of elements or features as shown in the figures. For example, when an upper part of a drawing is referred to as a "top" and a lower part of a drawing is referred to as a "bottom" for the sake of convenience, in practice, the "top" may also be called a "bottom" and the "bottom" may also be a "top" without departing from the teachings of the inventive concept (e.g., if the structure is rotate 180 degrees relative to the orientation of the figure).

Example embodiments are described herein with reference to block diagrams and/or flowchart illustrations of computer-implemented methods, apparatus (systems and/or devices) and/or computer program products. It is understood that a block of the block diagrams and/or flowchart illustrations, and combinations of blocks in the block diagrams and/or flowchart illustrations, can be implemented by computer program instructions that are performed by one or more computer circuits. These computer program instructions may be provided to a processor circuit of a general purpose computer circuit, special purpose computer circuit, and/or other programmable data processing circuit to produce a machine, such that the instructions, which execute via the processor of the computer and/or other programmable data processing apparatus, transform and control transistors, values stored in memory locations, and other hardware components within such circuitry to implement the functions/acts specified in the block diagrams and/or flowchart block or blocks, and thereby create means (functionality) and/or structure for implementing the functions/acts specified in the block diagrams and/or flowchart block(s).

These computer program instructions may also be stored in a tangible computer-readable medium that can direct a computer or other programmable data processing apparatus to function in a particular manner, such that the instructions stored in the computer-readable medium produce an article of manufacture including instructions which implement the functions/acts specified in the block diagrams and/or flowchart block or blocks. Accordingly, embodiments of present inventive concepts may be embodied in hardware and/or in software (including firmware, resident software, microcode, etc.) that runs on a processor (also referred to as a controller) such as a digital signal processor, which may collectively be referred to as "circuitry," "a module" or variants thereof.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of inventive concepts. Moreover, although some of the diagrams include arrows on communication paths to show a primary direction of communication, it is to be understood that communication may occur in the opposite direction to the depicted arrows.

Many variations and modifications can be made to the embodiments without substantially departing from the principles of the present inventive concepts. All such variations and modifications are intended to be included herein within the scope of present inventive concepts. Accordingly, the above disclosed subject matter is to be considered illustrative, and not restrictive, and the examples of embodiments are intended to cover all such modifications, enhancements, and other embodiments, which fall within the spirit and scope of present inventive concepts. Thus, to the maximum extent allowed by law, the scope of present inventive concepts are to be determined by the broadest permissible interpretation of the present disclosure including the following claims and their equivalents, and shall not be restricted or limited by the foregoing detailed description.

The invention claimed is:

1. A sensor comprising: a piezoelectric resonator substrate having a first surface and a second surface; a first electrode on the first surface of the piezoelectric resonator substrate; a second electrode on the second surface of the piezoelectric resonator substrate, wherein an active area of the piezoelectric resonator substrate is defined between the first electrode and the second electrode so that the active area of the piezoelectric resonator substrate is configured to generate shear motion in a direction of shear motion displacement that is parallel with respect to the first surface; and a channel structure rigidly coupled to the first surface of the piezoelectric resonator substrate, wherein the channel structure defines a serpentine channel between the channel structure and the piezoelectric resonator substrate, wherein the serpentine channel includes a plurality of channel segments connected in series, wherein the channel structure defines an inlet opening coupled with the serpentine channel to allow ingress of an analyte into a flow path defined by the serpentine channel, and wherein at least portions of the plurality of channel segments are on the active area of the piezoelectric resonator substrate and wherein the channel structure defines at least one of: a hydrophilic surface adjacent the serpentine channel; and a hydrophobic surface opposite the piezoelectric resonator substrate.

2. The sensor of claim 1 wherein the first electrode is between the first surface of the piezoelectric resonator substrate and the channel structure.

3. The sensor of claim 1, wherein the channel structure further defines an exit opening coupled with the serpentine channel, wherein the plurality of channel segments of the serpentine channel are coupled in series between the inlet opening and the exit opening to define the flow path for the analyte between the inlet opening and the exit opening.

4. The sensor of claim 1, wherein the piezoelectric resonator substrate comprises at least one of:

quartz; and a thin film piezoelectric material that comprises at least one of aluminum nitride ("AlN") and zinc oxide ("ZnO").

5. The sensor of claim 1, wherein each channel segment of the plurality of channel segments is parallel with respect to the direction of shear motion displacement, and wherein the plurality of channel segments includes at least one linear channel segment.

6. The sensor of claim 5, wherein the plurality of channel segments includes at least two linear channel segments.

7. The sensor of claim 6, wherein each channel segment of the plurality of channel segments is a linear channel segment.

8. The sensor of claim 1, wherein the serpentine channel is a serpentine capillary channel.

9. The sensor of claim 1, wherein the active area of the piezoelectric resonator substrate is configured to generate shear motion in the direction of shear motion displacement at a frequency in the range of about 1 MHz to about 5,000 MHz.

10. The sensor of claim 1, wherein each of the plurality of channel segments has a width in the range of about 5 micrometers to about 250 micrometers, a height in the range of about 1 micrometer to about 5 micrometer, and a length in the range of about 17 micrometers to about 20 micrometers.

11. The sensor of claim 1, wherein the channel structure comprises at least one of: gold, aluminum, titanium, and/or silicon dioxide; and a surfactant, a lubricant, and/or a desiccant adjacent the serpentine channel.

12. The sensor of claim 1, wherein the active area of the piezoelectric resonator substrate is configured to resonate based on a viscosity of the analyte.

13. The sensor of claim 12, wherein the active area of the piezoelectric resonator substrate is configured to generate a shift in resonance in response to the analyte having a high shear-rate viscosity.

14. The sensor of claim 13, wherein the shift in resonance comprises at least one of:

a shift in resonance spectrum; and a shift in resonance frequency and dissipation.

15. The sensor of claim 12, wherein the active area of the piezoelectric resonator substrate is configured to generate a plurality of shifts in resonance in response to the analyte having a low shear-rate viscosity.

16. The sensor of claim 15, wherein the plurality of shifts in resonance comprise at least one of:

shifts in resonance spectrum; and shifts in resonance frequency and dissipation.

17. The sensor of claim 1, wherein the active area of the piezoelectric resonator substrate is configured to enable a flow of the analyte through the plurality of channel segments based on a viscosity of the analyte.

18. The sensor of claim 1, wherein the piezoelectric resonator substrate, the first electrode, and the second electrode are part of an acoustic wave generator configured to confer an acoustic wave to the analyte within the structure.

19. The sensor of claim 1, wherein the active area of the piezoelectric resonator substrate is configured to provide a resonance dissipation response based on a material property of the analyte.

20. The sensor of claim 19, wherein the material property of the analyte includes at least one of:

density;

viscosity;

plastic viscosity; and differential viscosity.

* * * * *